(12) United States Patent
Lee (10) Patent No.: US 12,101,064 B2
(45) Date of Patent: Sep. 24, 2024

(54) VACUUM TUBE AMPLIFIER MODULE AND ASSEMBLY METHOD THEREOF

(71) Applicant: DREAMUS COMPANY, Seoul (KR)

(72) Inventor: Sun Yeol Lee, Bucheon-si (KR)

(73) Assignee: DREAMUS COMPANY, Seoul (KR)

( * ) Notice: Subject to any disclaimer, the term of this patent is extended or adjusted under 35 U.S.C. 154(b) by 286 days.

(21) Appl. No.: 17/891,847

(22) Filed: Aug. 19, 2022

(65) Prior Publication Data
US 2023/0064683 A1 Mar. 2, 2023

(30) Foreign Application Priority Data
Aug. 30, 2021 (KR) .................. 10-2021-0114853

(51) Int. Cl.
| | |
|---|---|
| *H04R 25/00* | (2006.01) |
| *H01J 35/06* | (2006.01) |
| *H03F 1/16* | (2006.01) |
| *H03F 3/02* | (2006.01) |

(52) U.S. Cl.
CPC ................ *H03F 1/16* (2013.01); *H01J 35/06* (2013.01); *H03F 3/02* (2013.01)

(58) Field of Classification Search
CPC .................................. H03F 1/16; H03F 3/02
USPC ......................................................... 381/413
See application file for complete search history.

(56) References Cited

FOREIGN PATENT DOCUMENTS

KR      10-2021-0084991 A      7/2021

*Primary Examiner* — Phylesha Dabney (57) ABSTRACT

The present exemplary embodiments proposes a vacuum tube amplifier module which removes a noise caused by external shock or vibration, including a vacuum tube amplifier which includes an amplifier in a vacuum tube to increase an energy of an input signal to output the energy as an output signal, an assembly unit which fixes at least one side of the vacuum tube amplifier so as to primarily remove the noise, and a magnet which is assembled in the assembly unit to levitate the amplifier so as to secondarily remove the noise to make the noise a predetermined reference value or lower.

13 Claims, 6 Drawing Sheets

VACUUM TUBE AMPLIFIER MODULE AND ASSEMBLY METHOD THEREOF

CROSS-REFERENCE TO RELATED APPLICATIONS

This application is based on and claims priority under 35 U.S.C. 119 to Korean Patent Application No. 10-2021-0114853 filed in the Korean Intellectual Property Office on Aug. 30, 2021, the entire contents of which are herein incorporated by reference in its entirety.

BACKGROUND

Field

The present disclosure relates to a vacuum tube amplifier module and an assembly method thereof, and more particularly, to a vacuum tube amplifier module which minimizes a noise by levitating an amplifier in the air using a positive pole of a magnet and an assembly method thereof.

Description of the Related Art

The contents described in this section merely provide background information on the present exemplary embodiment but do not constitute the related art.

When a mechanical shock or vibration is generated in a vacuum tube, a noise may be generated from the vacuum tube itself. The noise may be a hindrance to listen to the sound so that noise cancelling circuits or pogo pins are used to minimize the influence of the noise.

The vacuum tube amplifier of the related art uses pogo pins and is fixed so as to alleviate by means of the springs of the pogo pins, but a noise may be caused even by a small shock or vibration.

SUMMARY

According to the exemplary embodiments, a vibration is generated by a filament operation of a vacuum tube amplifier and a noise is generated by the vibration so that the amplifier is levitated in the air using a positive pole of the magnet to minimize a noise of a sound source by non-vibration fixing.

Other and further objects of the present disclosure which are not specifically described can be further considered within the scope easily deduced from the following detailed description and the effect.

According to an aspect of the present embodiment, the present disclosure proposes a vacuum tube amplifier module which removes a noise caused by external shock or vibration, including a vacuum tube amplifier which includes an amplifier in a vacuum tube to increase an energy of an input signal to output the energy as an output signal; an assembly unit which fixes at least one side of the vacuum tube amplifier so as to primarily remove the noise; and a magnet which is assembled in the assembly unit to levitate the amplifier so as to secondarily remove the noise to make the noise a predetermined reference value or lower.

Desirably, the assembly unit includes: an assembly guide unit which is assembled to partially enclose the vacuum tube amplifier on both sides of the vacuum tube amplifier; a bracket which supports the vacuum tube amplifier assembled with the assembly guide unit; and a guide pin which fixes the assembly guide unit to the bracket.

Desirably, the assembly guide unit includes: an assembly hole which is formed with the same shape as a part of the vacuum tube amplifier which is coupled to the vacuum tube amplifier to be easily detachable from the side of the vacuum tube amplifier; and a fastening hole which is formed with the same shape as the guide pin to allow the guide pin to pass therethrough.

Desirably, the assembly guide is fixed to the bracket by fixing the vacuum tube amplifier to the assembly hole and assembling the fastening hole with the guide pin and the assembly hole and the fastening hole are vertically formed so that the vacuum tube amplifier and the guide pin are vertically assembled with each other.

Desirably, the bracket includes: a fixing unit which is fastened with the guide pin; a protrusion with which the assembly guide unit is slidably assembled to prevent the distortion of the assembly guide unit; and a plate which is fixed with the fixing unit and the protrusion through an upper edge and supports the vacuum tube amplifier.

Desirably, the assembly guide unit includes: an assembly hole which is formed on the side of the vacuum tube amplifier to be easily detachable; a fastening hole which is provided on the line with the fixing unit so that the guide pin passes therethrough to be fastened with the fixing unit; and a fixing hole which is assembled with the protrusion to form a guide which prevents the distortion of the assembly guide unit, and the fixing hole is formed in a position spaced apart from the fastening hole to be assembled with the protrusion before the guide pin is fastened with the fastening hole.

Desirably, the magnet is provided between the assembly guide unit and the bracket by the guide pin and is formed with a circular shape so that the guide pin passes through an inner magnet hole, and an inner diameter of the magnet hole is implemented to be equal to or larger than an inner diameter of the guide pin.

Desirably, the magnet includes a first magnet attached to the assembly guide unit and a second magnet attached to the bracket, and the first magnet and the second magnet are provided to be spaced apart from each other with a predetermined distance therebetween.

Desirably, the amplifier is levitated in the air using magnetisms of the first magnet and the second magnet so that the noise generated by the vacuum tube becomes a predetermined reference value or lower.

Desirably, the vacuum tube amplifier further includes: a pogo pin which is formed at least one side to which the assembly unit is not fixed so as to primarily remove external shocks or shocks due to a vibration, by means of an elastic unit.

According to still another aspect of the present embodiment, the present disclosure proposes an assembly method of a vacuum tube amplifier module to remove a noise due to a vibration in a vacuum tube amplifier including: a step of assembling an assembly tube amplifier to be enclosed by an assembly guide unit on both sides of the vacuum tube amplifier; a step of placing a magnet between a bracket which supports the vacuum tube amplifier assembled with the assembly guide unit and the assembly guide unit; and a step of fixing the assembly guide unit and the magnet to the bracket by means of the guide pin.

Desirable, in the step of placing the magnet, a first magnet attached to an assembly guide unit assembled so as to partially enclose the vacuum tube amplifier on both sides of the vacuum tube amplifier and a second magnet attached to the bracket are located so that the noise generated by the vacuum tube becomes a predetermined reference value or lower by levitating the amplifier in the air.

Desirably, the step of fixing to the bracket includes: a step of slidably assembling a protrusion formed in the bracket with the assembly guide unit to prevent the distortion of the assembly guide unit; and a step of fastening the guide pin which passes through the assembly guide and the magnet to be fastened with a fixing unit formed in the bracket.

As described above, according to the exemplary embodiments of the present disclosure, a vacuum tube amplifier is fixed by a soft material and is levitated in the air using a magnet to minimize a contact surface, thereby minimizing the noise by improving a mechanical vibration.

Even if the effects are not explicitly mentioned here, the effects described in the following specification which are expected by the technical features of the present disclosure and their potential effects are handled as described in the specification of the present disclosure.

DETAILED DESCRIPTION OF THE EMBODIMENT

Hereinafter, embodiments of the present invention will be described in detail with reference to the accompanying drawings. Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the specification.

Unless otherwise defined, all terms (including technical and scientific terms) used in the present specification may be used as the meaning which may be commonly understood by the person with ordinary skill in the art, to which the present invention belongs. It will be further understood that terms defined in commonly used dictionaries should not be interpreted in an idealized or excessive sense unless expressly and specifically defined.

Terms used in the present application are just used to describe a specific exemplary embodiment and do not intend to limit the present invention and a singular expression may include a plural expression as long as it is not apparently contextually different. In the present application, it should be understood that the term "include" or "have" indicates that a feature, a number, a step, an operation, a component, a part or the combination those of described in the specification is present, but do not exclude a possibility of presence or addition of one or more other features, numbers, steps, operations, components, parts or combinations, in advance.

Terms including an ordinary number, such as first and second, are used for describing various constituent elements, but the constituent elements are not limited by the terms. The above terms are used only to distinguish one component from the other component. For example, without departing from the scope of the present invention, a first component may be referred to as a second component, and similarly, a second component may be referred to as a first component. A term of and/or includes combination of a plurality of related elements or any one of the plurality of related elements.

The present disclosure relates to a vacuum tube amplifier module and an assembly method thereof.

When a noise is generated due to a small vibration of a filament operation, a vacuum tube amplifier module 10 levitates the vacuum tube amplifier in the air using a positive pole of a magnet to minimize the noise of the sound source by no-vibration fixing.

The vacuum tube amplifier module 10 levitates a vacuum tube amplifier using a polarity of the magnet to absorb external vibration and allow a user to listen to the sound source using the best condition without a noise of the vacuum tube amplifier itself.

The vacuum tube amplifier module 10 improves a noise caused by vibration unique to the vacuum tube amplifier and shocks and minimizes a vibration of a filament embedded in the vacuum tube amplifier to improve the noise generation.

Figure 1:
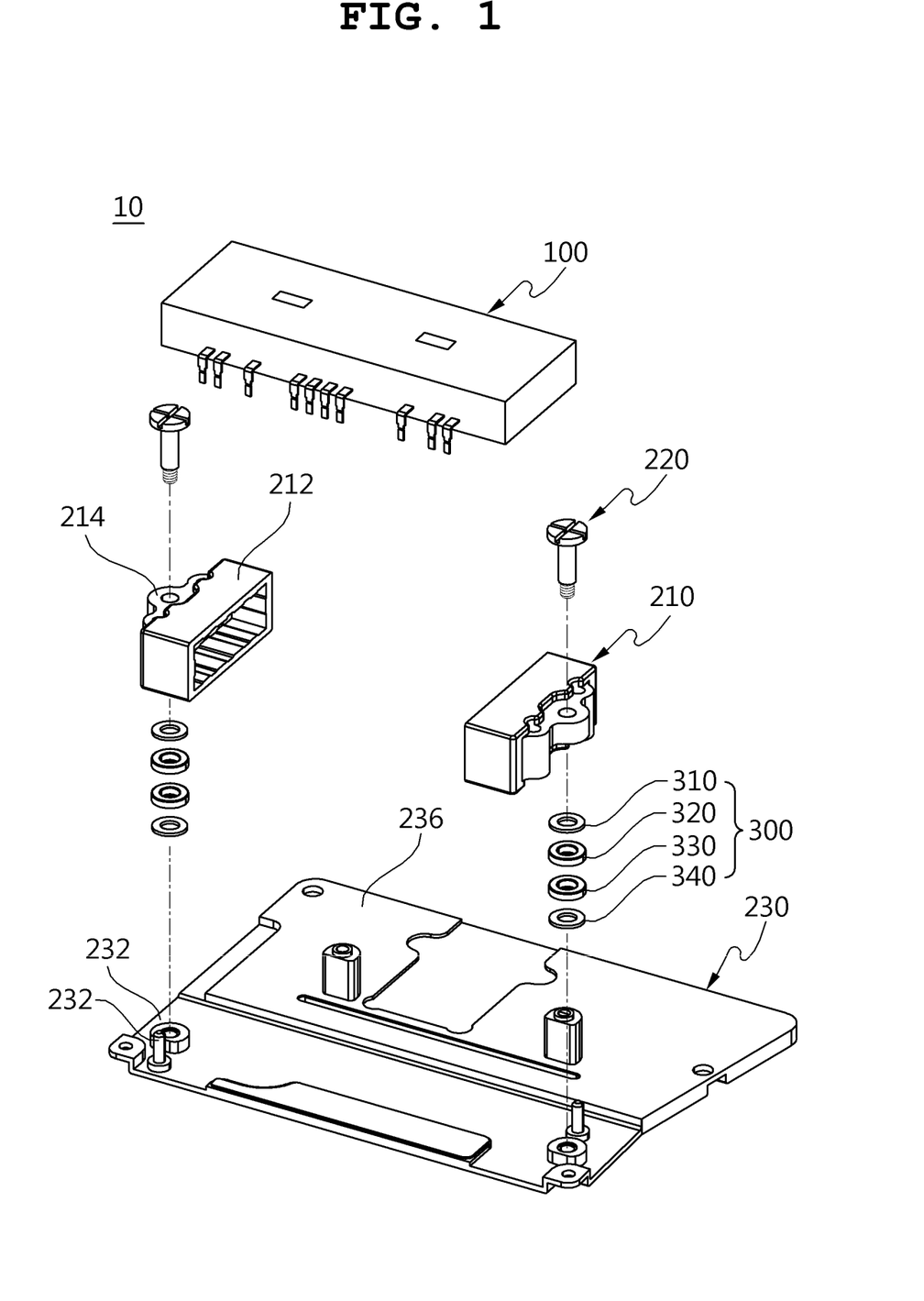
FIG. 1 is a view illustrating an exploded shape of components of a vacuum tube amplifier module according to an exemplary embodiment of the present disclosure.

FIG. 1 is a view illustrating an exploded shape of components of a vacuum tube amplifier module according to an exemplary embodiment of the present disclosure.

Referring to FIG. 1, the vacuum tube amplifier module 10 includes a vacuum tube amplifier 100, an assembly unit 200, and a magnet 300. The vacuum tube amplifier module 10 may omit some components among various components which are exemplarily illustrated in FIG. 1 or may further include other component.

The vacuum tube amplifier 100 includes an amplifier in a vacuum tube to increase an energy of an input signal to output the energy as an output signal.

In the vacuum tube amplifier 100, a vacuum tube amplifies a signal and a filament, a cathode, a grid, and a plate are spaced apart from each other with a small interval so that the vacuum tube amplifier may be vulnerable to a vibration.

The vacuum tube amplifier 100 may further include pogo pins 120 formed on at least one side to which the assembly unit 200 is not fixed so as to primarily remove external shocks or shock due to the vibration by means of an elastic unit. For example, the pogo pins 120 may be formed on both sides of the vacuum tube amplifier 100, but is not necessarily limited thereto.

The assembly unit 200 may fix at least one side of the vacuum tube amplifier to primarily remove the noise.

The assembly unit 200 includes an assembly guide unit 210, a guide pin 220, and a bracket 230. The assembly unit 200 may omit some components among various components which are exemplarily illustrated in FIG. 1 or may further include other component.

The assembly guide unit 210 is assembled to partially enclose the vacuum tube amplifier 100 on both sides of the vacuum tube amplifier 100 and is implemented by an elastic material. For example, the assembly guide unit 210 may be implemented by rubber, but is not necessarily limited thereto.

The assembly guide unit 210 includes an assembly hole 212 and a fastening hole 214.

The assembly hole 212 may be formed with the same shape as a portion to be coupled to the vacuum tube amplifier 100 so as to be easily detachable from a side of the vacuum tube amplifier 100.

The fastening hole 214 may be formed with the same shape as the guide pin 220 so that the guide pin 220 passes therethrough.

The assembly guide unit 210 fixes the vacuum tube amplifier 100 to the assembly hole 212 and assembles the guide pin 220 into the fastening hole 214 to be fixed to the bracket 230. Here, the assembly hole 212 and the fastening hole 214 are formed to be perpendicular to each other so that the vacuum tube amplifier 100 and the guide pin 220 are assembled to be perpendicular to each other.

The assembly guide unit 210 further includes a fixing hole 216.

The fixing hole 216 is assembled with the protrusion 234 to form a guide which prevents a distortion of the assembly guide unit 210.

The fixing hole 216 is formed in a position spaced apart from the fastening hole 214 to be assembled with the protrusion 234 before the guide pin 220 is fastened with the fastening hole 214.

The guide pin 220 fixes the assembly guide unit 210 to the bracket 230.

The bracket 230 supports the vacuum tube amplifier 100 assembled in the assembly guide unit 210.

The bracket 230 includes a fixing unit 232, the protrusion 234, and the plate 236. The bracket 230 may omit some components among various components which are exemplarily illustrated in FIG. 1 or may further include other component.

The fixing unit 232 is fastened with the guide pin 220.

The protrusion 234 is slidably assembled with the assembly guide unit 210 to prevent the distortion of the assembly guide unit 210.

The fixing unit 232 and the protrusion 234 are fixed to an upper end of the plate 236 and the plate 236 supports the vacuum tube amplifier 100.

The magnet 300 is assembled with the assembly unit 200 to levitate the amplifier 112 so that the noise is secondarily removed to be equal to or lower than a predetermined reference value.

The magnet 300 is provided between the assembly guide unit 210 and the bracket 230 by the guide pin 220 and is formed to have a circular shape so that the guide pin 220 passes through an inner magnet hole. At this time, an inner diameter of the magnet hole may be implemented to be equal to or larger than an inner diameter of the guide pin 220.

The magnet 300 includes a first magnet 320 which is attached to the assembly guide unit 210 and a second magnet 330 which is attached to the bracket 230.

The first magnet 320 and the second magnet 330 may be provided to be spaced apart from each other with a predetermined distance.

The vacuum tube amplifier module 10 levitates the amplifier 112 in the air using the magnetism of the first magnet 320 and the second magnet 330 to make the noise caused by the vacuum tube 114 equal to or lower than a predetermined reference value.

Referring to FIG. 1, the magnet 300 includes the first magnet 320 and the second magnet 330 and further includes a first magnet tape 310 and a second magnet tape 340 to fix the first magnet 320 and the second magnet 330 to the assembly guide unit 210 and the bracket 230. Specifically, the first magnet 320 is attached to a lower edge on which the fastening hole 214 of the assembly guide unit 210 is formed, by the first magnet tape 310 and the second magnet 330 is attached to an upper edge of the fixing unit 232 of the bracket 230 by the second magnet tape 340. Here, even though it is illustrated that the magnet 300 further includes the first magnet tape 310 and the second magnet tape 340 to fix the first magnet 320 and the second magnet 330, it is not necessarily limited thereto so that the first magnet 320 and the second magnet 330 may be fixed by a separate component.

Figure 2:
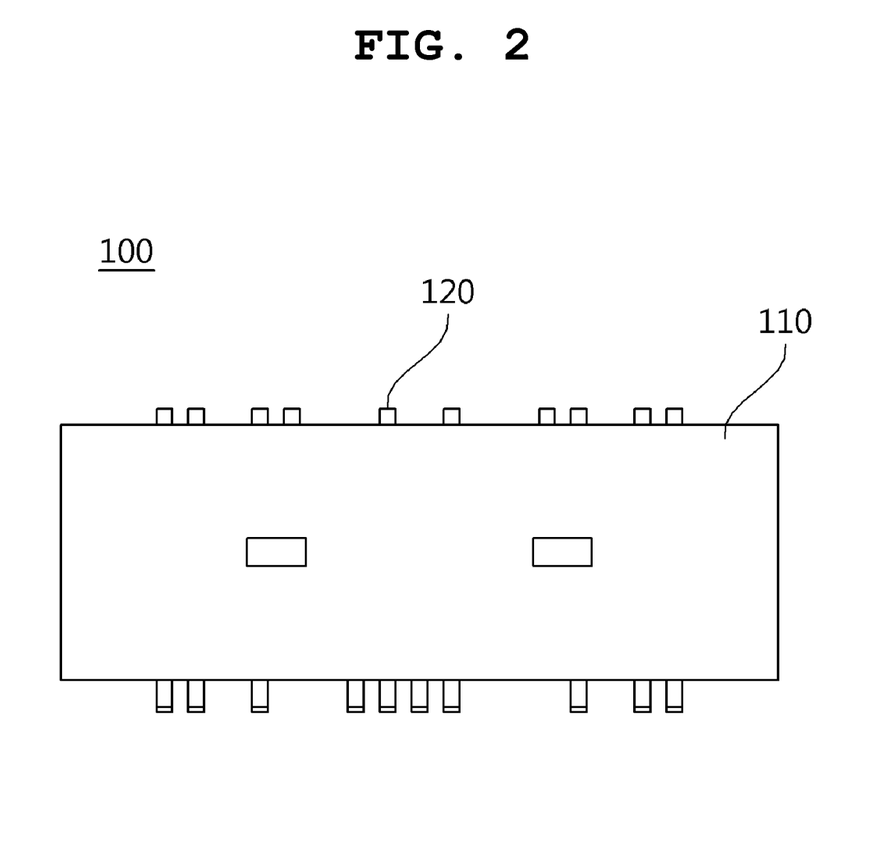
FIG. 2 is a view illustrating a vacuum tube amplifier according to an exemplary embodiment of the present disclosure.

FIG. 2 is a view illustrating a vacuum tube amplifier according to an exemplary embodiment of the present disclosure.

Referring to FIG. 2, the vacuum tube amplifier 100 includes a main body 110 and pogo pins 120.

The vacuum tube amplifier 100 is an amplifier manufactured by using a vacuum tube as an amplifying element. The main body 110 of the vacuum tube amplifier 100 includes an amplifier 112 and a vacuum tube 114.

The vacuum tube 114 is implemented with a structure to be spaced apart from the amplifier 112 including a filament, a cathode, a grid, and a plate with a small interval and the vacuum tube may be vulnerable to a vibration.

The pogo pins 120 are cylinder type spring pins and are connected to be in contact with a circuit board.

Specifically, the pogo pins 120 have springs inserted therein so that the shock is alleviated by the inserted springs.

According to the exemplary embodiment of the present disclosure, the assembly unit 200 and the magnet 300 are applied to the vacuum tube amplifier 100 illustrated in FIG. 2 to improve a mechanical vibration.

Even though it is illustrated that a plurality of pogo pins 120 is provided on both sides in a length direction and 10 pogo pins are provided on each side, it is not necessarily limited thereto.

Figure 3:
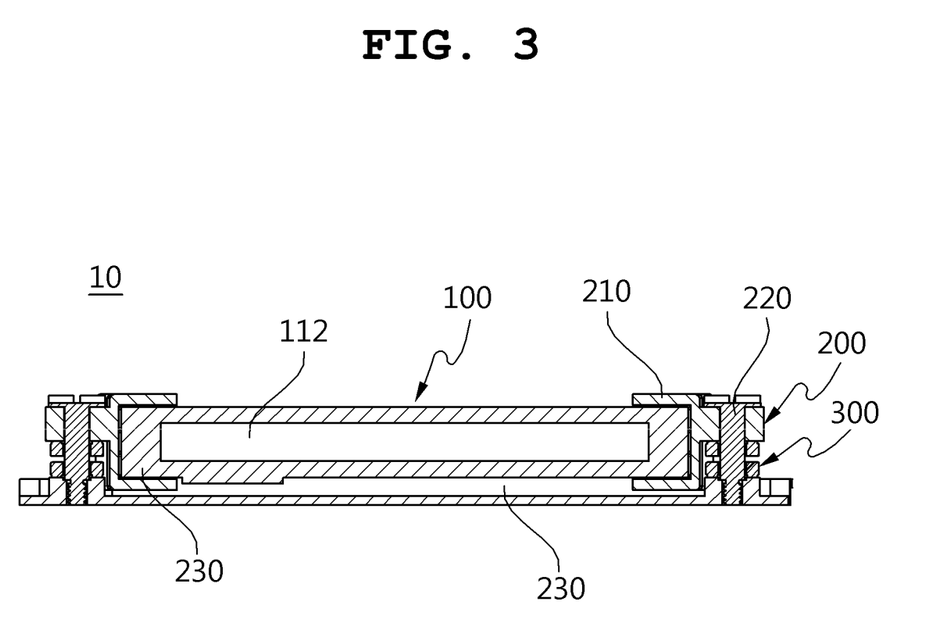
FIGS. 3 to 5 are views illustrating a vacuum tube amplifier module according to an exemplary embodiment of the present disclosure.
Figure 4:
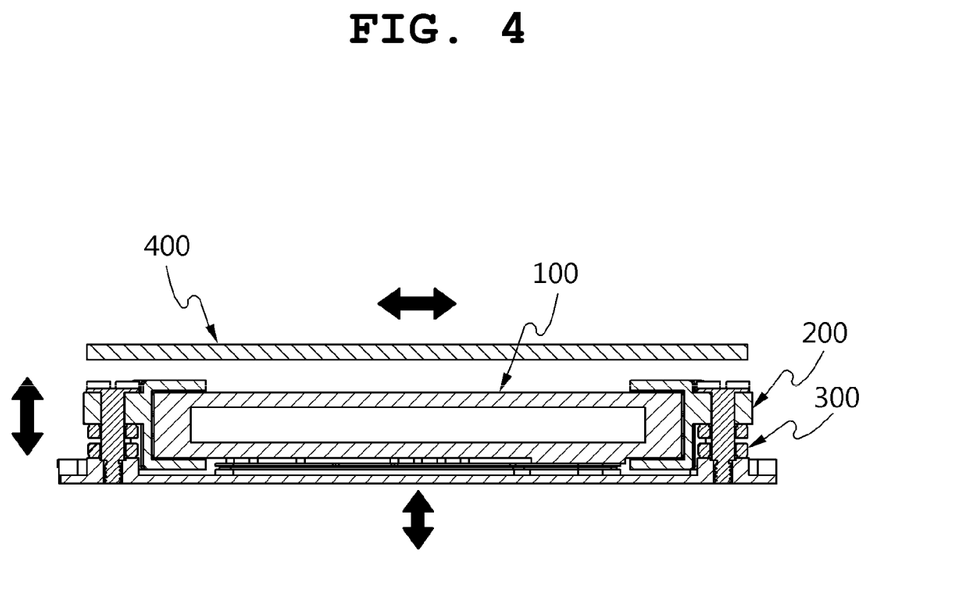
Figure 5:
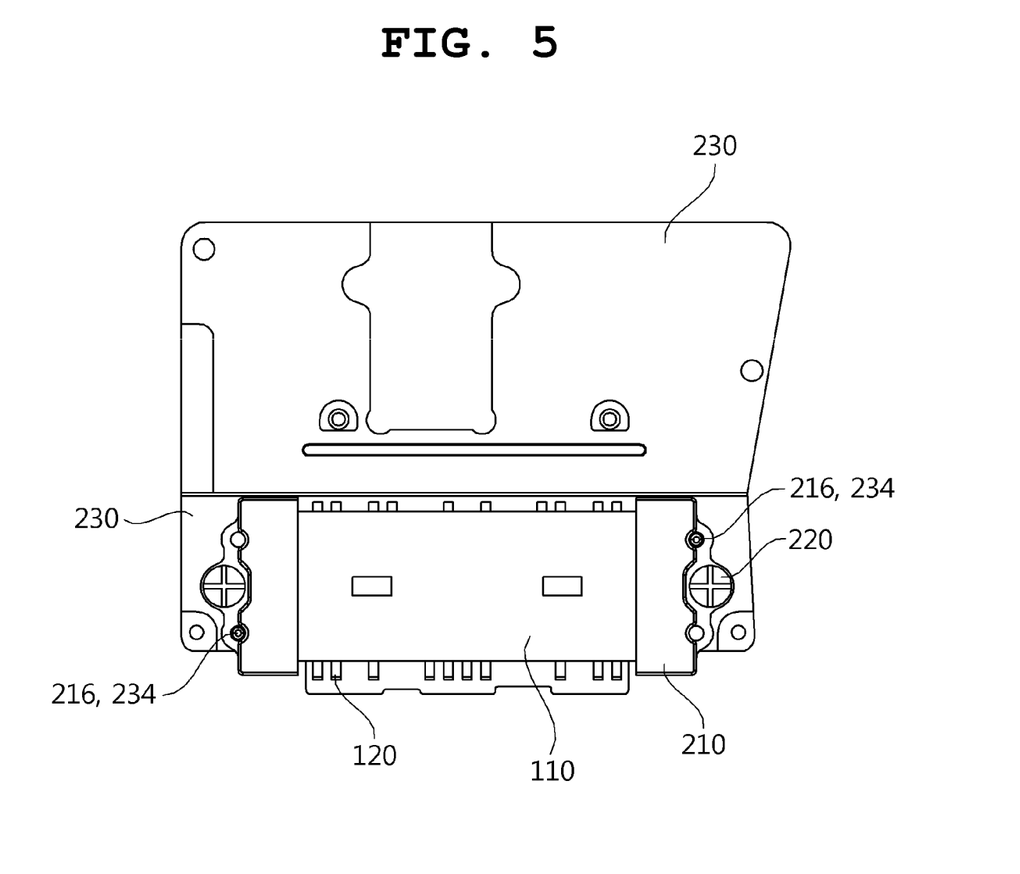

FIGS. 3 to 5 are views illustrating a vacuum tube amplifier module according to an exemplary embodiment of the present disclosure.

FIG. 3 is a side cross-sectional view illustrating of a vacuum tube amplifier module according to an exemplary embodiment of the present disclosure, FIG. 4 is an exemplary view illustrating a motion of a vacuum tube amplifier module according to an exemplary embodiment of the present disclosure, and FIG. 5 is a top view illustrating a vacuum tube amplifier according to an exemplary embodiment of the present disclosure.

The vacuum tube amplifier module 10 applies a customized specific structure to minimize amplifier microphonic of the vacuum tube amplifier 100 to be applied to a vacuum tube in which a microphonic noise is caused due to the small mechanical shock or vibration.

A noise is a noise of the vacuum tube 114 itself generated when a mechanical shock or vibration is applied to the vacuum tube 114 and is caused by the vibration of an electrode. In order to remove the noise of the vacuum tube 114 itself, the vacuum tube amplifier module 10 levitates the amplifier (AMP) 112 in the vacuum tube 114 using the same positive pole of the magnet 300 to minimize a contact surface of the amplifier (AMP) 112 in the vacuum tube 114, thereby improving the mechanical vibration and shock.

According to the exemplary embodiment of the present disclosure, the vacuum tube amplifier 100 includes a magnet therein and is implemented to be levitated in the air using the positive poles of the magnet in the vacuum tube amplifier 100 and the magnet 300. Specifically, the vacuum tube amplifier module 10 is implemented such that the magnet included in the vacuum tube amplifier 100 and the magnet 300 push from each other due to the polarities therebetween to levitate the vacuum tube amplifier 100 to prevent the external shock.

According to the fixing method of a vacuum tube amplifier of the related art, the shock is alleviated using the pogo pins 120 so that there is a problem in that the noise is caused even by the small shock and vibration. Here, the pogo pins 120 alleviates the shock using the elastic material and the elastic material is used for the spring.

The vacuum tube amplifier module 10 primarily minimizes the vibration of the vacuum tube amplifier 100 with the assembly unit 200 implemented with a soft material and secondarily improves the mechanical vibration by levitating the amplifier 112 in the air using the magnet 300 to minimize the contact surface of the amplifier 112.

According to the exemplary embodiment of the present disclosure, the assembly unit 200 may be formed of a material such as rubber, but is not necessarily limited thereto.

Referring to FIG. 3, the vacuum tube amplifier 100 is partially enclosed by the assembly unit 200. Specifically, the vacuum tube amplifier 100 is partially enclosed by the assembly guide unit 210 of the assembly unit 200 on both sides and is in contact with the bracket 230 of the assembly unit 200 on a lower edge.

The assembly guide unit 210 is formed to have a rectangular shape to enclose a part of the vacuum tube amplifier 100 formed with a rectangular shape and the assembly hole 212 is formed in a portion assembled with the vacuum tube amplifier 100 and the fastening hole 214 is formed in an opposite portion to the portion in which the assembly hole 212 is formed to be fixed to the bracket 230.

According to the exemplary embodiment of the present disclosure, even though it is illustrated that the assembly guide unit 210 is assembled in a width direction of the vacuum tube amplifier 100, it is not necessarily limited thereto.

The assembly guide unit 210 is formed to be partially in contact with the bracket 230, but is not necessarily limited thereto.

At this time, the assembly guide unit 210 which encloses both sides of the vacuum tube amplifier 100 is coupled and fixed to the bracket 230 through the guide pin.

The guide pint 220 is assembled in the order of the assembly guide unit 210, the magnet 300, and the bracket 230 in the assembling direction and is coupled to the bracket 230 to be fixed. At this time, the guide pin 220 and the bracket 230 are fixed by a screw fastening manner, but is not necessarily limited thereto.

According to the exemplary embodiment of the present disclosure, the vacuum tube amplifier module 10 primarily seals the assembly guide unit 210 formed of a flexible silicon material and modulates the vacuum tube amplifier using a positive pole of a small magnet 300 and levitates the vacuum tube amplifier in the air to be physically separated from the PCB 400, thereby minimizing vibration and shocks.

Referring to FIG. 4, the amplifier 112 is levitated in the air using the magnetism of the magnet 300 to minimize the noise of the vacuum tube itself generated when a mechanical shock or vibration is applied to the vacuum tube 114.

The vacuum tube amplifier module 10 is formed to be spaced apart from the PCB 400 with a predetermined distance on an upper edge so that vibration and shocks may be minimized.

Referring to FIG. 5, the assembly unit 200 which is assembled on both sides of the vacuum tube amplifier 100 may be formed such that both sides are vertically and horizontally symmetrical to each other.

According to the exemplary embodiment of the present disclosure, the guide pin 220 is assembled in the fastening hole 214 formed in the center of the assembly guide unit 210. At this time, the protrusion 234 formed in the bracket 230 and the fixing hole 216 formed in the assembly guide unit 210 are coupled to each other at a left side or a right side of the fastening hole 214 to which the guide pin 220 is fastened to prevent the distortion of the assembly guide unit 210.

Even though it is illustrated that the protrusion 234 is formed at only one of the left side or the right side of the fastening hole 214 to which the guide pin 220 is fastened, it is not necessarily limited thereto, so that the protrusions may be formed on both sides. Further, even though it is illustrated that protrusions 234 located at the left side and the right side are located in a diagonal direction, it is not necessarily limited thereto.

According to the exemplary embodiment of the present disclosure, the vacuum tube amplifier module 10 may be used for all products which may minimize the noise caused by the shocks or vibrations using the positive pole of the magnet, but is not necessarily limited thereto.

Accordingly, the vacuum tube amplifier module 10 primarily minimizes the noise by the assembly unit 210 formed of a soft material and secondarily minimizes the noise by the magnet 200 so that the noise may be reduced to be equal to or lower than a predetermined reference value.

Figure 6:
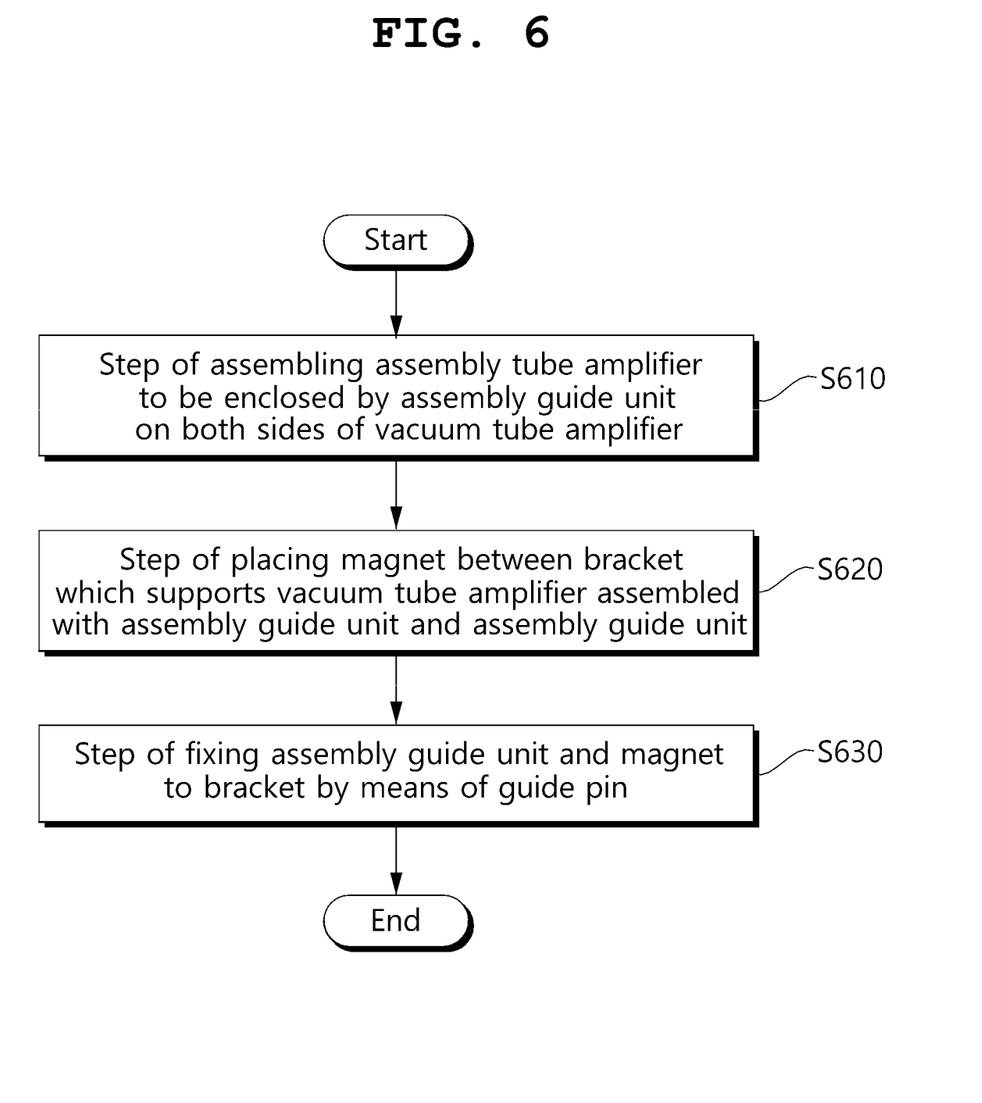
FIG. 6 is a flowchart illustrating an assembly method of a vacuum tube amplifier module according to an exemplary embodiment of the present disclosure.

FIG. 6 is a flowchart illustrating an assembly method of a vacuum tube amplifier module according to an exemplary embodiment of the present disclosure. The assembly method of a vacuum tube amplifier module is a method of applying an assembly unit and a magnet to a vacuum tube amplifier to minimize a microphonic noise of the vacuum tube amplifier and a redundant description will be omitted.

The assembly method of a vacuum tube amplifier module includes a step S610 of assembling an assembly tube amplifier to be enclosed by an assembly guide unit on both sides of the vacuum tube amplifier, a step S620 of placing a magnet between a bracket which supports the vacuum tube amplifier assembled with the assembly guide unit and the assembly guide unit, and a step S630 of fixing the assembly guide unit and the magnet to the bracket through the guide pin.

In the step S620 of placing a magnet between a bracket which supports the vacuum tube amplifier assembled with the assembly guide unit and the assembly guide unit, in order to levitate the amplifier in the air to reduce the noise generated by the vacuum tube to be equal to or lower than a predetermined reference value, a first magnet attached to the assembly guide unit which is assembled to partially enclose the vacuum tube amplifier on both sides of the vacuum tube amplifier of the assembly unit and a second magnet attached to the bracket may be located.

The step S630 of fixing the assembly guide unit and the magnet to the bracket through the guide pin includes a step of slidably assembling a protrusion formed in the bracket into the assembly guide unit to prevent the distortion of the assembly guide unit; and a step of fastening the guide pin which passes through the assembly guide and the magnet with a fixing unit formed in the bracket.

In FIG. 6, the respective processes are sequentially performed, but this is merely illustrative and those skilled in the art may apply various modifications and changes by changing the order illustrated in FIG. 6 or performing one or more processes in parallel or adding another process without departing from the essential gist of the exemplary embodiment of the present disclosure. The above description illustrates a technical spirit of the present invention as an example and various changes, modifications, and substitutions become apparent to those skilled in the art within a scope of an essential characteristic of the present invention. Therefore, as is evident from the foregoing description, the exemplary embodiments and accompanying drawings disclosed in the present invention do not limit the technical spirit of the present invention and the scope of the technical spirit is not limited by the exemplary embodiments and accompanying drawings. The protection scope of the present invention should be interpreted based on the following appended claims and it should be appreciated that all technical spirits included within a range equivalent thereto are included in the scope of the present invention.

What is claimed is:

1. A vacuum tube amplifier module which removes a noise caused by external shock or vibration, comprising:
   a vacuum tube amplifier which includes an amplifier in a vacuum tube to increase an energy of an input signal to output the energy as an output signal;
   an assembly unit which fixes at least one side of the vacuum tube amplifier so as to primarily remove the noise; and
   a magnet which is assembled in the assembly unit to levitate the amplifier so as to secondarily remove the noise to make the noise a predetermined reference value or lower.

2. The vacuum tube amplifier module according to claim 1, wherein the assembly unit includes:
   an assembly guide unit which is assembled on both sides of the vacuum tube amplifier to partially enclose the vacuum tube amplifier and is implemented with an elastic material;
   a bracket which supports the vacuum tube amplifier assembled with the assembly guide unit; and
   a guide pin which fixes the assembly guide unit to the bracket.

3. The vacuum tube amplifier module according to claim 2, wherein the assembly guide unit includes:
   an assembly hole which is formed with the same shape as a part of the vacuum tube amplifier which is coupled to the vacuum tube amplifier to be easily detachable from the side of the vacuum tube amplifier; and
   a fastening hole which is formed with the same shape as the guide pin to allow the guide pin to pass therethrough.

4. The vacuum tube amplifier module according to claim 3, wherein the assembly guide is fixed to the bracket by fixing the vacuum tube amplifier to the assembly hole and assembling the fastening hole with the guide pin and the assembly hole and the fastening hole are vertically formed so that the vacuum tube amplifier and the guide pin are vertically assembled with each other.

5. The vacuum tube amplifier module according to claim 2, wherein the bracket includes:
   a fixing unit which is fastened with the guide pin;
   a protrusion with which the assembly guide unit is slidably assembled to prevent the distortion of the assembly guide unit; and
   a plate which is fixed with the fixing unit and the protrusion through an upper edge and supports the vacuum tube amplifier.

6. The vacuum tube amplifier module according to claim 5, wherein the assembly guide unit includes:
   an assembly hole which is formed on the side of the vacuum tube amplifier to be easily detachable;
   a fastening hole which is provided on the line with the fixing unit so that the guide pin passes therethrough to be fastened with the fixing unit; and
   a fixing hole which is assembled with the protrusion to form a guide which prevents the distortion of the assembly guide unit, and
   the fixing hole is formed in a position spaced apart from the fastening hole to be assembled with the protrusion before the guide pin is fastened with the fastening hole.

7. The vacuum tube amplifier module according to claim 2, wherein the magnet is provided between the assembly guide unit and the bracket by the guide pin and is formed with a circular shape so that the guide pin passes through an inner magnet hole and an inner diameter of the magnet hole is implemented to be equal to or larger than an inner diameter of the guide pin.

8. The vacuum tube amplifier module according to claim 7, wherein the magnet includes:
   a first magnet attached to the assembly guide unit; and
   a second magnet attached to the bracket, and
   the first magnet and the second magnet are provided to be spaced apart from each other with a predetermined distance therebetween.

9. The vacuum tube amplifier module according to claim 8, wherein the amplifier is levitated in the air using magnetisms of the first magnet and the second magnet so that the noise generated by the vacuum tube becomes a predetermined reference value or lower.

10. The vacuum tube amplifier module according to claim 1, wherein the vacuum tube amplifier further includes: a pogo pin which is formed at least one side to which the assembly unit is not fixed so as to primarily remove external shocks or shocks due to a vibration, by means of an elastic unit.

11. An assembly method of a vacuum tube amplifier module to remove a noise due to a vibration in a vacuum tube amplifier, comprising:
   a step of assembling an assembly tube amplifier to be enclosed by an assembly guide unit on both sides of the vacuum tube amplifier;
   a step of placing a magnet between a bracket which supports the vacuum tube amplifier assembled with the assembly guide unit and the assembly guide unit; and
   a step of fixing the assembly guide unit and the magnet to the bracket by means of the guide pin.

12. The assembly method according to claim 11, wherein in the step of placing the magnet, a first magnet attached to an assembly guide unit assembled so as to partially enclose the vacuum tube amplifier on both sides of the vacuum tube amplifier and a second magnet attached to the bracket are located so that the noise generated by the vacuum tube becomes a predetermined reference value or lower by levitating the amplifier in the air.

13. The assembly method according to claim 11, wherein the step of fixing to the bracket includes:
   a step of slidably assembling a protrusion formed in the bracket with the assembly guide unit to prevent the distortion of the assembly guide unit; and
   a step of fastening the guide pin which passes through the assembly guide and the magnet to be fastened with a fixing unit formed in the bracket.

* * * * *